United States Patent
Miki (10) Patent No.: US 7,790,625 B2
(45) Date of Patent: Sep. 7, 2010

(54) METHOD FOR MANUFACTURING SEMICONDUCTOR DEVICE

(75) Inventor: Shinsuke Miki, Miyazaki (JP)

(73) Assignee: Oki Semiconductor Co., Ltd., Tokyo (JP)

(*) Notice: Subject to any disclaimer, the term of this patent is extended or adjusted under 35 U.S.C. 154(b) by 237 days.

(21) Appl. No.: 12/043,165

(22) Filed: Mar. 6, 2008

(65) Prior Publication Data

US 2008/0227292 A1 Sep. 18, 2008

(30) Foreign Application Priority Data

Mar. 13, 2007 (JP) ............... 2007-062939

(51) Int. Cl.
*H01L 21/302* (2006.01)
(52) U.S. Cl. .............. 438/749; 438/704; 438/745
(58) Field of Classification Search ......... 438/700–715, 438/745–751, 9
See application file for complete search history.

(56) References Cited

U.S. PATENT DOCUMENTS

| | | | | |
|---|---|---|---|---|
| 5,313,966 A | * | 5/1994 | Sadamori | .............. 134/76 |
| 5,896,875 A | | 4/1999 | Yoneda | |
| 6,281,033 B1 | | 8/2001 | Uayanagi et al. | |
| 2002/0142617 A1 | * | 10/2002 | Stanton | .............. 438/749 |

FOREIGN PATENT DOCUMENTS

| JP | 09008043 | 1/1997 |
|---|---|---|
| JP | 09069509 | 3/1997 |
| JP | 2000196106 | 7/2000 |
| JP | 2004283803 | 10/2004 |
| JP | 2006145547 | 8/2006 |

* cited by examiner

*Primary Examiner*—Dung A. Le
(74) *Attorney, Agent, or Firm*—Volentine & Whitt, P.L.L.C.

(57) ABSTRACT

A method of manufacturing a semiconductor device includes preparing a semiconductor wafer, forming a semiconductor function element on the semiconductor wafer, drying the semiconductor wafer after forming the semiconductor function element by using an isopropyl alcohol vapor, heating the semiconductor wafer after drying the semiconductor wafer, and performing a cleaning on the semiconductor wafer after heating the semiconductor wafer by using a fuming nitric acid.

7 Claims, 7 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device and, in particular, to a technique to remove a residue generated during a heating process.

2. Description of the Related Art

In recent years, structures of semiconductor devices such as an acceleration sensor have become increasingly finer, and thus contamination of the semiconductor wafer by fine particles or trace amount of metal directly affects the reliability and production yield of the semiconductor devices. Therefore, cleaning of the semiconductor wafer is one of the critical steps in manufacturing the semiconductor devices.

There are various approaches to clean the semiconductor wafer which depends on the types of contamination of the semiconductor wafer. For instance, in order to remove an organic material, an oxidizing acid such as $H_2SO_4$ is used, whereas in order to remove an oxidized film residue and a native-oxidized film, aqueous hydrogen fluoride (HF) is used. In order to remove contaminants including particles and metallic impurities, a so-called RCA cleaning method has been proposed by W. Kern and D. A. Puotinen in RCA Review, vol. 31, pp. 187, 1970 which uses a first solution (SC1) including aqueous ammonia solution ($NH_4OH$) and hydrogen peroxide solution ($H_2O_2$) and a second solution (SC2) including hydrochloric acid (HCl) and hydrogen peroxide solution. In this case, SC1 is effective for removing the particles and SC2 is effective for removing the metallic impurities.

After the above described cleaning process, a drying process of the semiconductor wafer is performed. Among various drying techniques, a spin drying process is the most common technique. This technique however has several drawbacks such as generation of dust from a spin drying apparatus, buildup of an electrostatic charge due to high-speed rotation of the apparatus, and generation of a stain called a 'watermark' on a surface of the semiconductor wafer. In the case of a small-scale acceleration sensor having a plurality of fine openings, the clearance between a movable center weight and a proximal section therefrom is merely an order of several microns. Therefore, a drying process using a temperature-controlled bath may cause an operation problem due to sticking of the center weight and the proximal section.

In order to avoid these problems, several approaches have been proposed, such as drying the semiconductor wafer by using an isopropyl alcohol vapor or drying the semiconductor wafer by vertically drawing up the semiconductor wafer, so that the semiconductor wafer passes through an interface between isopropyl alcohol and pure water.

In Japanese Patent Application Kokai (Laid open) No. H9-069509, another drying technique is disclosed which has the steps of, after cleaning the semiconductor wafer by pure water, spraying isopropyl alcohol vapor onto a surface of the semiconductor wafer in order to absorb moisture on the surface of the semiconductor wafer, and then drying the semiconductor wafer at a temperature of 100° C. while blowing nitrogen onto the semiconductor wafer. The drying technique of Japanese Patent Application Kokai No. H9-069509 thus remarkably reduces generation of stains because the surface of the semiconductor wafer is dried under the nitrogen atmosphere.

However, the drying of the semiconductor wafer by using the isopropyl alcohol vapor may generate a residue of the isopropyl alcohol vapor on the surface of the semiconductor wafer. It has been found that an additional cleaning step after drying the semiconductor wafer under the isopropyl alcohol vapor atmosphere may cause a reaction between the residue of isopropyl alcohol vapor, cleaning solution and a conducting layer formed on the semiconductor wafer. This reaction leads to a problem of dissolution of the conducting layer. Specifically, it has been found that a reaction between the residue of isopropyl alcohol vapor, fuming nitric acid and an aluminum or aluminum alloy (Al—Si—Cu) conducting layer dissolves the conducting layer. Dissolution of the conducting layer may deteriorate characteristics of the semiconductor device and may lead to an operation problem of the semiconductor device.

SUMMARY OF THE INVENTION

One object of the present invention is to provide a method for manufacturing a semiconductor device which prevents a cleaning and a drying process of the semiconductor wafer from adversely affecting the product quality of the semiconductor device.

According to one aspect of the present invention, there is provided a method of manufacturing a semiconductor device which includes preparing a semiconductor wafer, forming a semiconductor function element on the semiconductor wafer, drying the semiconductor wafer after forming the semiconductor function element by using an isopropyl alcohol vapor, heating the semiconductor wafer after drying the semiconductor wafer, and performing a cleaning on the semiconductor wafer after heating the semiconductor wafer by using a fuming nitric acid.

Since a residue of the isopropyl alcohol vapor attached to a surface of the semiconductor wafer after the drying process is removed by heating the semiconductor wafer using the isopropyl alcohol vapor according to the method of manufacturing the semiconductor device of the present invention, dissolution of the conducting layer can be prevented in the subsequent cleaning process.

DETAILED DESCRIPTION OF THE INVENTION

Embodiments of the present invention will be hereinafter described in detail with reference to the accompanying drawings.

Figure 1:
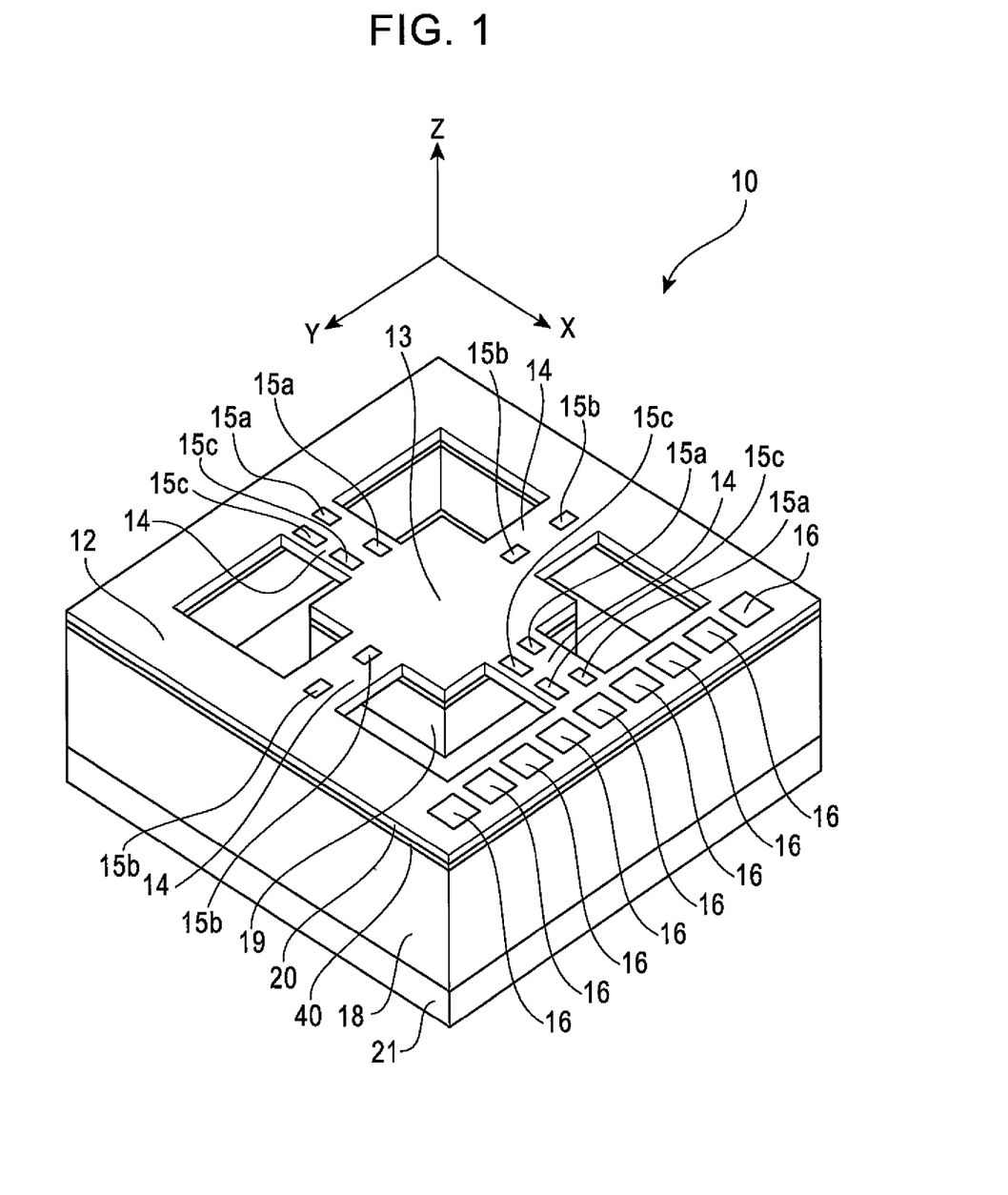
FIG. 1 is a perspective view of a piezoresistance type three-axis acceleration sensor.
Figure 2A:
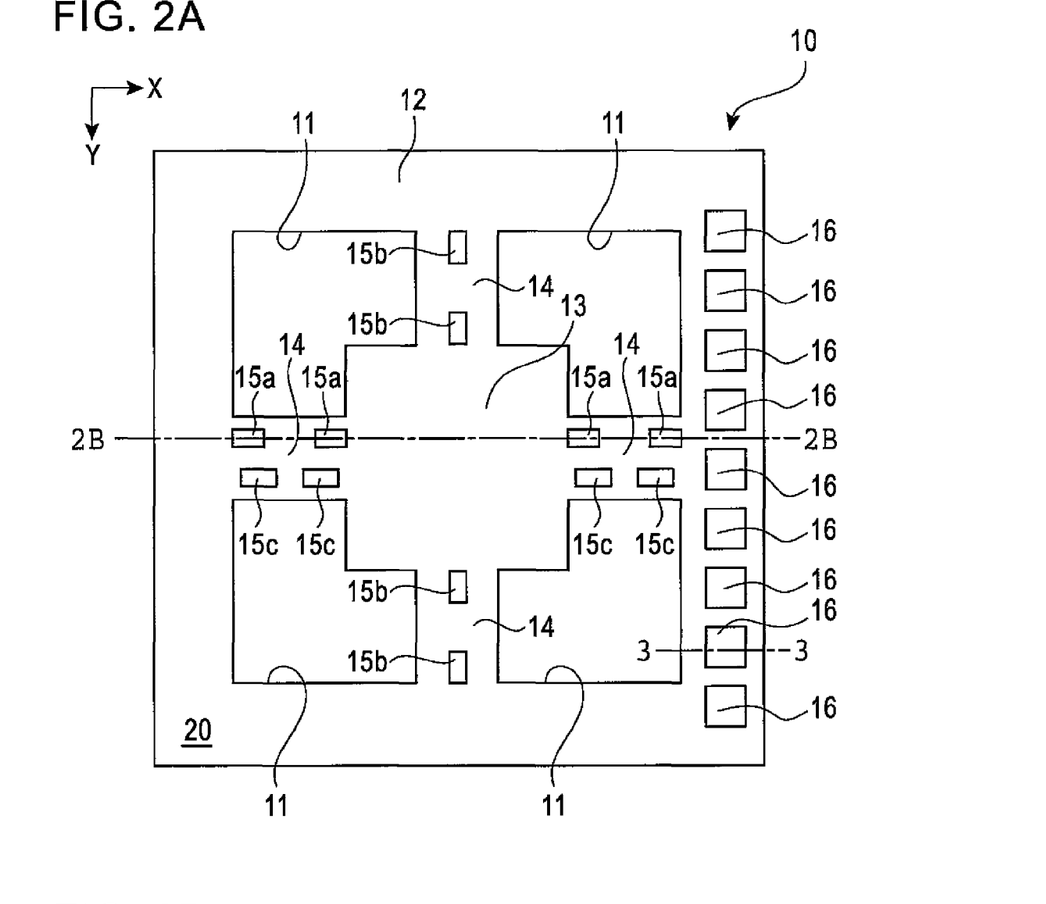
FIG. 2A is a plan view showing the piezoresistance type three-axis acceleration sensor.
Figure 2B:
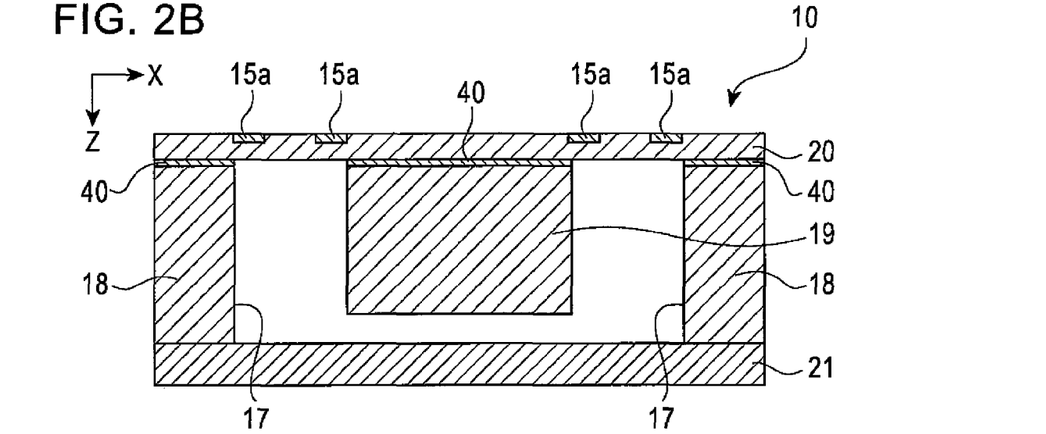
FIG. 2B is a cross-sectional view of the acceleration sensor along the dashed-dotted line 2B-2B in FIG. 2A.

As shown in FIGS. 1, 2A and 2B, a piezoresistance type three-axis acceleration sensor 10 includes a first silicon wafer 20 having a thin square shape. The first silicon wafer 20 has four L-shaped openings 11 near its four corners such that the first silicon wafer 20 is provided with a peripheral fixed portion 12, a central square-shaped weight-fixing portion 13, and four beam sections 14. Specifically, the peripheral fixed portion 12 is connected with the central square-shaped weight-fixing portion 13 via the four beam sections 14.

Each of the four beam sections 14 has at least one pair of piezoresistance elements 15a, 15b, 15c which have features that their electric resistances vary depending on a mechanical stress applied thereto. A main surface of the first silicon wafer 20 having the piezoresistance elements 15a, 15b, 15c is covered with an intermediate layer (not shown in FIGS. 1, 2A and 2B) having an electrical isolation property. On the intermediate layer, a metal interconnection (not shown in FIGS. 1, 2A and 2B) and a plurality of bonding pads 16 are formed which output signals indicating changes of electric resistances from the piezoresistance elements to an external circuit. The metal interconnection and the bonding pads 16 may be formed, for example, by sputtering aluminum and aluminum alloy, respectively. The bonding pads 16 are electrically connected to the piezoresistance elements 15a, 15b, 15c via the metal interconnection which passing through a contact hole (not shown) formed in the intermediate layer.

The acceleration sensor 10 includes a pedestal 18 having a rectangular cylinder shape with a through hole 17 formed therein. The pedestal 18 is configured to correspond to the peripheral fixed portion 12 of the first silicon wafer 20. Positioned in a center of the through hole 17 is a weight section 19 having a cubic shape. The height of the weight section 19 is smaller than that of the pedestal 18. An upper surface of the pedestal 18 is attached to a lower surface of the peripheral fixed portion 12 via a joining layer 40. An upper surface of the weight section 19 is attached to a lower surface of the weight-fixing portion 13 via the joining layer 40. A lower surface of the pedestal 18 is attached on a sensor mounting section 21 which is made of, for example, glass.

The weight section 19 is supported by the four beam sections 14 such that the weight section 19 is movable in directions of an X, Y and Z axes. Acceleration is detected based on a principle that a force proportional to the acceleration and applied to the weight section 19 displaces the weight section 19 relative to the pedestal 18 and thus bends the beam section 14 in an X, Y and/or Z directions, which changes the resistance values of the piezoresistance elements 15a, 15b, 15c. Accordingly, the acceleration in three-axis directions can be measured by detecting the change of the resistance values via the interconnection and the bonding pads 16.

Figure 3:
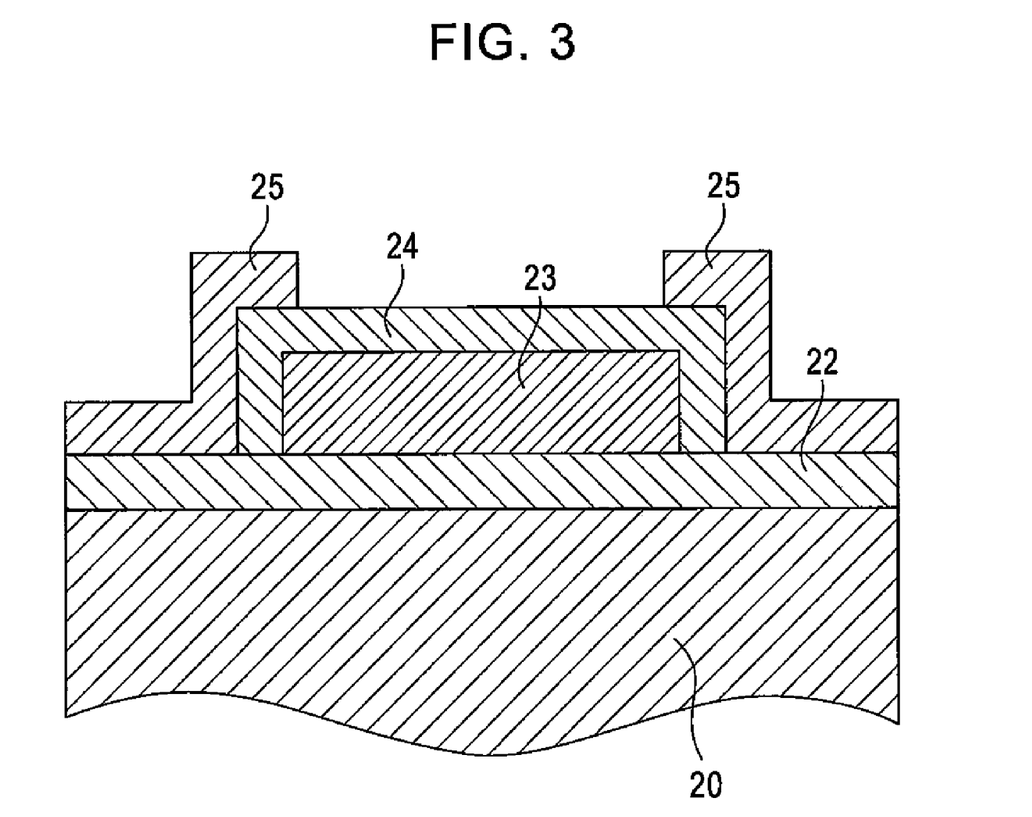
FIG. 3 is a cross-sectional view of the acceleration sensor along the dashed-dotted line 3-3 in FIG. 2A.

An embodiment of a structure of the bonding pads 16 will be hereinafter described with reference to FIG. 3.

As described above, the main surface of the first silicon wafer 20 is covered with the intermediate layer 22 having an electrical isolation property. On the intermediate layer 22, an aluminum layer 23 as an underlying layer is formed by sputtering aluminum. On the aluminum layer 23, an aluminum alloy layer 24 is provided so as to cover the aluminum layer 23. The aluminum alloy layer 24 is formed by sputtering aluminum alloy such as Al—Si—Cu. Over these layers, a protection layer 25 made of, for example, silicon nitride film is formed so as to cover a part of the aluminum layer 23 and aluminum alloy layer 24 and to cover whole of the intermediate layer 22. Specifically, after forming the protection layer 25 to cover whole surface of the aluminum alloy layer 24, a part of the protection layer 25 is removed by a photolithographic and etching technique so as to expose a part of the aluminum alloy layer 24. With this arrangement, the bonding pads 16 are allowed to electrically contact with the external circuit. That is to say, a signal indicating change of the electrical resistance of the piezoresistance elements 15a, 15b, 15c is output to the external circuit via the bonding pads 16 characterized by the aluminum alloy layer 24 and the interconnection characterized by the aluminum layer 23.

A method for manufacturing the piezoresistance type three-axis acceleration sensor 10 will be hereinafter described with reference to FIGS. 4, 5A-5D and 6A-6D.

Figure 4:
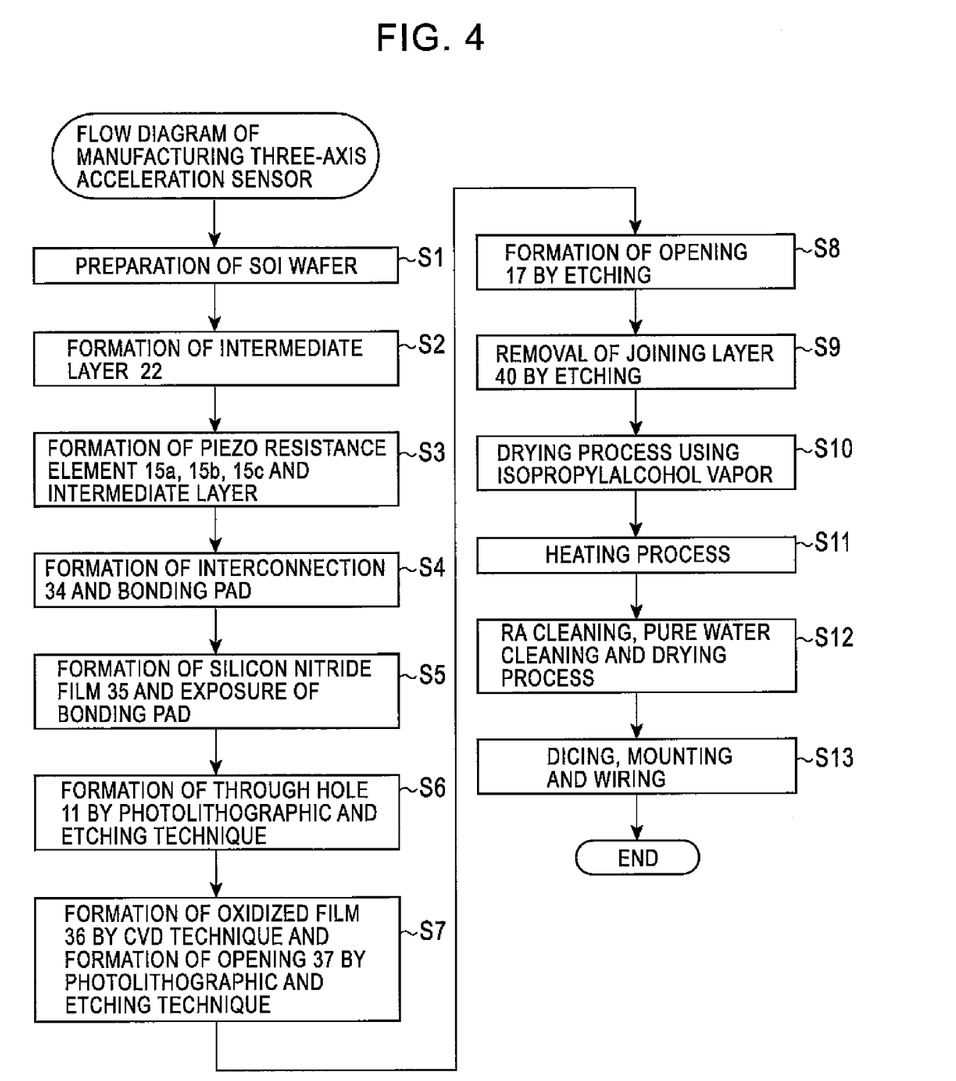
FIG. 4 is a flow diagram showing a manufacturing method of the piezoresistance type three-axis acceleration sensor according to an embodiment of the present invention.
Figure 5A:
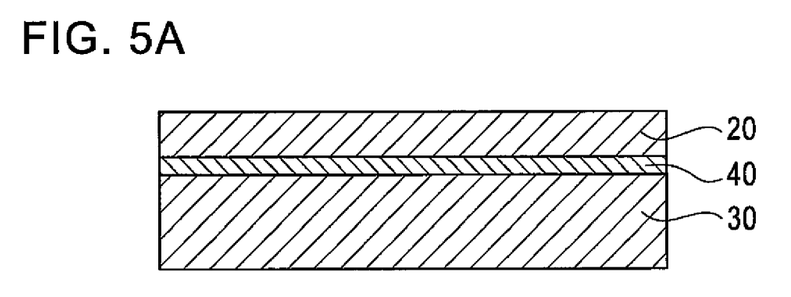
FIGS. 5A to 5D are cross-sectional views of the piezoresistance type three-axis acceleration sensor showing a series of the manufacturing steps.

As shown in FIG. 4, firstly, an SOI (Silicon on Insulator) wafer of a three-layered structure including a first silicon wafer 20, a second silicon wafer 30 and a joining layer 40 is prepared (step S1). A cross-sectional view of the SOI wafer is shown in FIG. 5A.

Figure 5B:
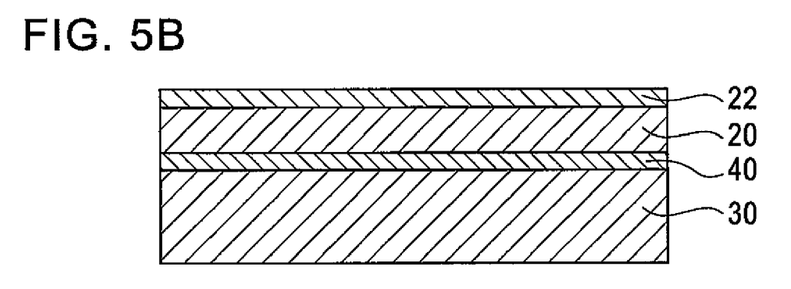

On a surface of the first silicon wafer 20, an intermediate layer 22 is formed under a thermal oxidation condition using a humid atmosphere at a temperature around 1000° C. (step S2). A cross-sectional view of the SOI wafer after forming the intermediate layer 22 is shown in FIG. 5B.

Figure 5C:
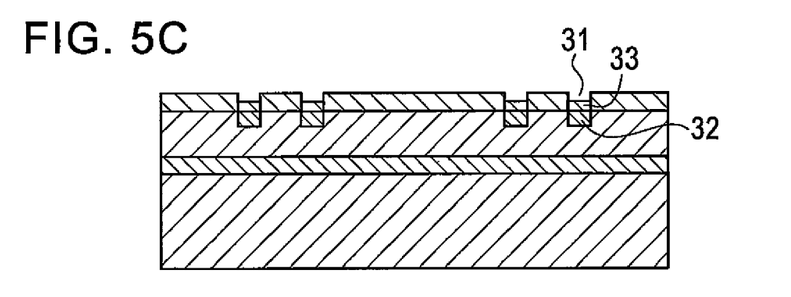

An opening 31 is formed in the intermediate layer 22 by a photolithographic and etching technique. A P-type diffusion layer 32 that plays a role of the piezoresistance elements 15a, 15b, 15c is formed on the first silicon wafer 20 by a boron diffusion process. On a surface of the diffusion layer 32, an intermediate oxidized film 33 is formed by a CVD (Chemical Vapor Deposition) process (step S3). A cross-sectional view of the SOI wafer after forming the intermediate oxidized film 33 is shown in FIG. 5C.

Figure 5D:
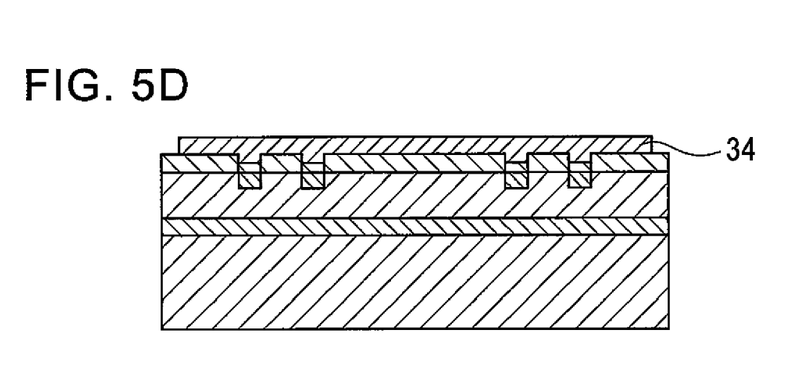

A hole for an electrode (not shown) is formed in the intermediate oxidized film 33 by a photolithographic and etching technique. Aluminum is then deposited on the intermediate layer 22 by a sputtering process. Aluminum alloy (Al—Si—Cu) is further deposited to cover the aluminum by a sputtering process. The deposited aluminum and aluminum alloy are etched by a photolithographic and etching technique to form the interconnection 34 and the bonding pad (not shown) (step S4). A cross-sectional view of the SOI wafer after forming the interconnection 34 and the bonding pad is shown in FIG. 5D.

Figure 6A:
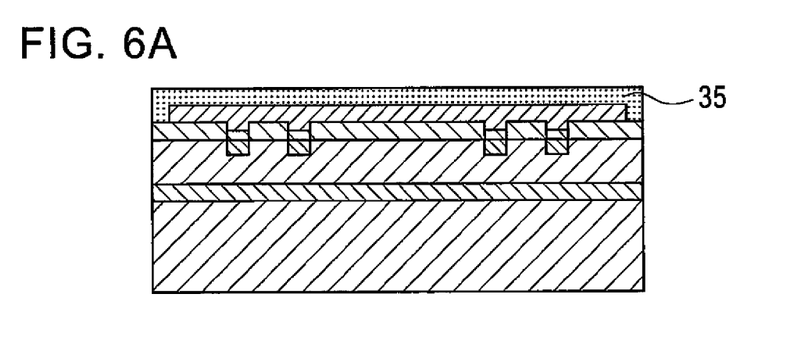
FIGS. 6A to 6D are cross-sectional views of the piezoresistance type three-axis acceleration sensor showing a series of the manufacturing steps.

Over the intermediate layer 22, and on surfaces of the interconnection 34 and the bonding pad formed on the intermediate layer 22, a silicon nitride film 35 as a protection layer is formed by a PRD (Plasma Reactive Deposition) process. In order to expose the bonding pad, only a part of the silicon nitride film 35 formed on the bonding pad is removed by a photolithographic and etching technique (step S5). A cross-sectional view of the SOI wafer after forming the silicon nitride film 35 is shown in FIG. 6A.

A photoresist is applied on the silicon nitride film 35. A through hole 11 is then formed by a photolithographic and etching technique (step S6).

Figure 6B:
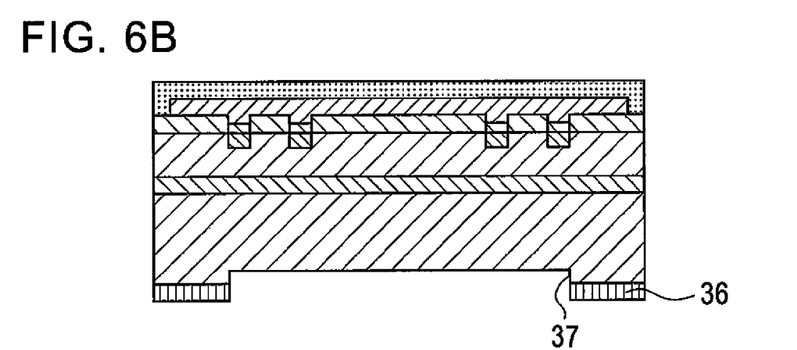

On a bottom surface of the SOI wafer, i.e., on a surface of the second silicon wafer 30, an oxidized film 36 is formed by a CVD technique. A central portion of the oxidized film 36 is removed by the photolithographic and etching technique so as to form an opening 37 (step S7). Consequently, a peripheral portion of the oxidized film 36 is left at peripheral area of the bottom surface of the SOI wafer which corresponds to an area where a pedestal 18 will be formed in the subsequent step. Formation of the opening 37 also allows forming a weight section 19 in the subsequent step such that the height of the weight section 19 is shorter than that of the pedestal 18. A cross-sectional view of the SOI wafer after forming the opening 37 is shown in FIG. 6B.

Figure 6C:
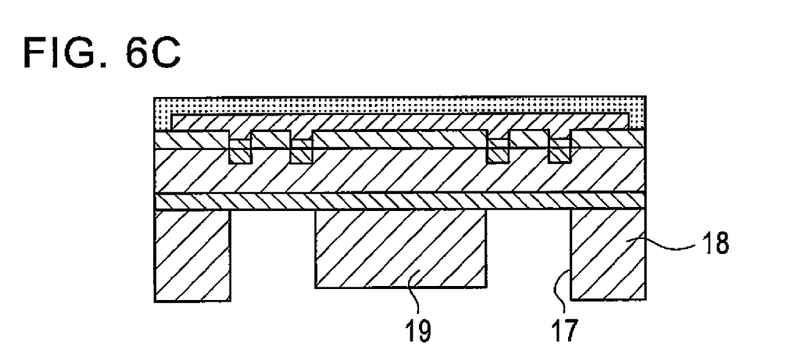

A photoresist (not shown) is applied at a central area of the opening 37 so as to correspond to an area where the weight section 19 will be formed. By using the photoresist and the peripheral portion of the oxidized film 36 as an etching mask, the second silicon wafer 30 is etched so as to form a through hole 17 in the second silicon wafer 30 (step S8). In this etching step, a Gas Chopping Etching Technique (GCET) or a so-called Bosch process is used. A cross-sectional view of the SOI wafer after forming the through hole 17 is shown in FIG. 6C.

Figure 6D:
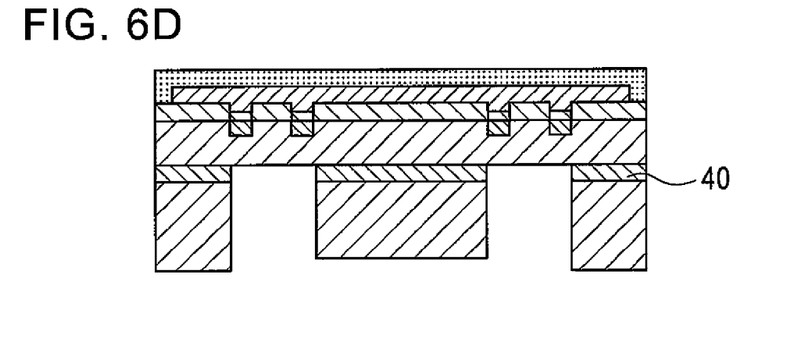

The SOI wafer after completion of the step S8 is then dipped into a buffered solution of fluorinated acid so as to remove by etching a part of the joining layer 40 exposed by the formation of the through hole 17 (step S9). A cross-sectional view of the SOI wafer after the removal of the part of the joining layer 40 is shown in FIG. 6D.

The SOI wafer after completion of the step S9, i.e., the SOI wafer having a function of a semiconductor element, is then dried for about 15 minutes by using the isopropyl alcohol vapor (step S10). Since this drying process uses the isopropyl alcohol vapor having a lower surface tension, sticking between the weight section 19 and the proximal section can be prevented.

In order to remove a residue of the isopropyl alcohol used in the step S10, the SOI wafer is heated in a heating chamber (step S11). The heating chamber may be controlled at, for example, pressure of 700 mTorr and temperature of 130° C. with continuous supply of oxygen at a rate of 500 SCCM. This condition may be kept for sixty minutes during this heating process. Since the residue of the isopropyl alcohol is removed by this heating process, none of the bonding pad dissolves even though a cleaning is performed in the following step.

After the heating process of step S8, a cleaning is performed for five minutes by using fuming nitric acid. After the cleaning, a pure water cleaning is performed. Further, in order to remove the pure water, a drying process using isopropyl alcohol vapor is performed (step S12).

The SOI wafer is then cut to produce a plurality of chips in a manner similar to the conventional dicing method for manufacturing the semiconductor device. Each of the chips is fixed on a sensor mounting section 31 or installed in a housing, and then an electrical connection is installed (step S13).

As described above, in a manufacturing method of the piezoresistance type three-axis acceleration sensor, the drying process uses the isopropyl alcohol vapor having a lower surface tension. Therefore, sticking between the weight section 19 and the proximal section can be prevented and the cleaning can be carried out without dissolving the bonding pad.

Although the embodiment of the method for manufacturing the semiconductor device has been described based on the piezoresistance type three-axis acceleration sensor, the embodiment of the present invention is not limited thereto. The embodiment of the present invention can be applied to any semiconductor devices on condition that such devices are manufactured by at least the successive steps of S10 through S12.

Figure 7:
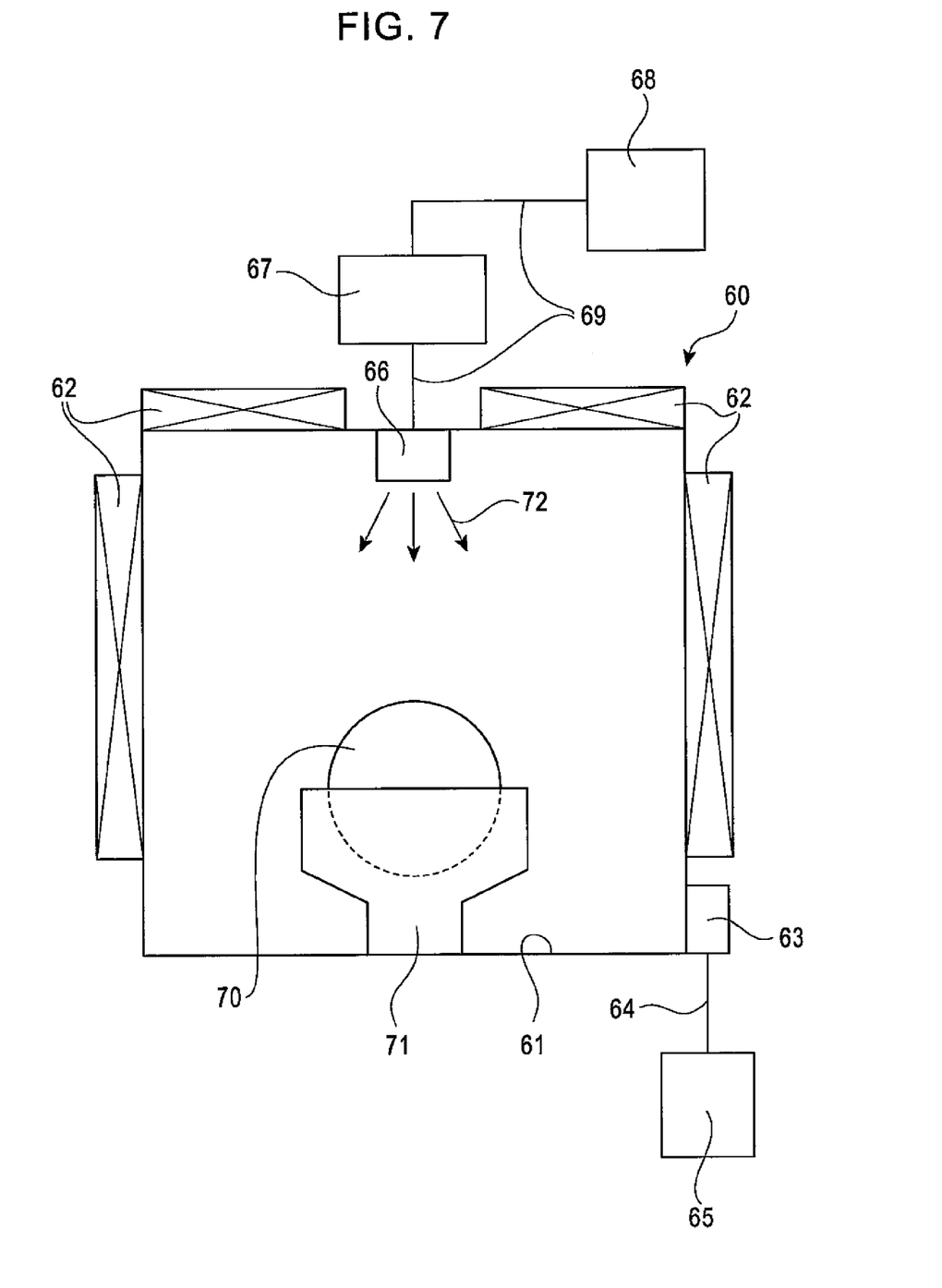
FIG. 7 is a schematic block diagram of a heating chamber for a heating process in a manufacturing method of the semiconductor device according to an embodiment of the present invention.

The heating chamber used in the heating process of the step S11 having features of the present invention will be hereinafter described with reference to FIG. 7 showing schematic configuration of the heating chamber.

As shown in FIG. 7, the heating chamber 60 has a sealed space 61. Heating devices 62 are provided on a side panel and a top panel of the heating chamber 60. The side panel of the heating chamber 60 also has an exhaust port 63 at a lower portion. A vacuum pump 65 is connected to the exhaust port 63 via an exhaust line 64. At an upper center portion of the sealed space 61, a spray nozzle 66 is provided for blowing oxygen. The spray nozzle 66 is connected to a flowmeter 67 and an oxygen gas source 68 via a supply line 69 which are installed outside of the heating chamber 60.

At a lower center portion of the sealed space 61, a wafer cassette 71 made of Teflon (registered trademark) is placed which receives one or a plurality of semiconductor wafers 70 already washed by the isopropyl alcohol vapor. It should be noted that a plurality of wafer cassettes 71 may be placed in the sealed space 61.

The sealed space 61 is controlled to have a specified constant temperature such as 130° C. by the heating devices 62. After placing the wafer cassette 71 including the semiconductor wafer 70 in the sealed space 61, the sealed space 61 is evacuated to establish a low-pressure condition such as 700 mTorr by the vacuum pump 65. After establishing the low-pressure condition, oxygen gas 72 is supplied to the sealed space 61 from the oxygen gas source 68 via the spray nozzle 66. A flow rate of the oxygen gas 72 may be, for example, 500 SCCM. It should be noted that the above described apparatuses for controlling the conditions of the heating chamber 60 may be connected to a control unit (not shown) to automatically control the sealed space 61 at prescribed conditions.

The semiconductor wafer 70 is kept in the sealed space 61 having the above described operating conditions for a prescribed time period such as 60 minutes. The semiconductor wafer 70 and the wafer cassette 71 therefor are both taken out from the sealed space 61 and sent to a subsequent process of the step S12.

This application is based on Japanese Patent Application No. 2007-062939 filed on Mar. 13, 2007 and the entire disclosure thereof is incorporated herein by reference.

What is claimed is:

1. A method of manufacturing a semiconductor device comprising:

preparing a semiconductor wafer;

forming a semiconductor function element on the semiconductor wafer;

drying the semiconductor wafer after forming the semiconductor function element by using an isopropyl alcohol vapor;

heating the semiconductor wafer after drying the semiconductor wafer; and performing a cleaning on the semiconductor wafer after heating the semiconductor wafer by using a fuming nitric acid.

2. The method of manufacturing a semiconductor device according to claim 1, wherein the heating step is carried out under a low pressure atmosphere.

3. The method of manufacturing a semiconductor device according to claim 2, wherein the atmosphere includes oxygen.

4. The method of manufacturing a semiconductor device according to claim 3, wherein the heating step is carried out for about 60 minutes in an atmosphere having a pressure of about 700 mTorr and a temperature of about 130° C. and an oxygen flow rate of about 500 SCCM (Standard Cubic Centimeter per Minute).

5. The method of manufacturing a semiconductor device according to claim 1, wherein the forming step of a semiconductor function element includes:
   forming a conducting layer on the semiconductor wafer by a sputtering process;
   forming an interconnection and a bonding pad by from the conducting layer with a photolithographic and etching process;
   forming a protective layer of silicon nitride over a main surface of the semiconductor wafer after forming the interconnection and the bonding pad; and
   exposing only the bonding pad from the protective layer with a photolithographic and etching process.

6. The method of manufacturing a semiconductor device according to claim 5, wherein the sputtering step is performed by sputtering an aluminum as an underlying layer, and subsequently by sputtering an aluminum alloy on the underlying layer.

7. The method of manufacturing a semiconductor device according to claim 1, wherein the semiconductor function element is a three-axis acceleration sensor.

* * * * *